(12) United States Patent
Gorczyca et al.

(10) Patent No.: US 8,427,845 B2
(45) Date of Patent: Apr. 23, 2013

(54) ELECTRICAL CONNECTORS FOR OPTOELECTRONIC DEVICE PACKAGING

(75) Inventors: Thomas Bert Gorczyca, Schenectady, NY (US); Stefan Rakuff, Clifton Park, NY (US); Michael Scott Herzog, Voorheesville, NY (US)

(73) Assignee: General Electric Company, Niskayuna, NY (US)

( * ) Notice: Subject to any disclaimer, the term of this patent is extended or adjusted under 35 U.S.C. 154(b) by 297 days.

(21) Appl. No.: 12/787,950

(22) Filed: May 26, 2010

(65) Prior Publication Data

US 2010/0296261 A1 Nov. 25, 2010

Related U.S. Application Data

(63) Continuation-in-part of application No. 12/470,033, filed on May 21, 2009.

(51) Int. Cl.
*H05K 7/00* (2006.01)

(52) U.S. Cl.
USPC ........................................... 361/820

(58) Field of Classification Search ............. 361/820; 174/50.5, 261; 313/504, 505, 509, 512; 257/40, 257/83, 84, 98, 99
See application file for complete search history.

(56) References Cited

U.S. PATENT DOCUMENTS

| | | | |
|---|---|---|---|
| 3,660,593 A | 5/1972 | Bowles | |
| 4,458,101 A | 7/1984 | Cookson et al. | |
| 5,397,238 A | 3/1995 | Och | |
| 6,134,300 A | 10/2000 | Trebes et al. | |
| 6,305,975 B1 | 10/2001 | Steiner | |
| 6,353,658 B1 | 3/2002 | Trebes et al. | |
| 6,413,645 B1 | 7/2002 | Graff et al. | |
| 6,492,026 B1 | 12/2002 | Graff et al. | |
| 6,537,688 B2 | 3/2003 | Silvernail et al. | |
| 6,624,568 B2 | 9/2003 | Silvernail | |
| 6,661,029 B1 | 12/2003 | Duggal | |
| 6,700,322 B1 | 3/2004 | Duggal et al. | |
| 6,777,871 B2 | 8/2004 | Duggal et al. | |
| 6,800,999 B1 | 10/2004 | Duggal et al. | |
| 7,011,983 B2 | 3/2006 | Foust et al. | |

(Continued)

FOREIGN PATENT DOCUMENTS

| | | |
|---|---|---|
| DE | 202007017609 U1 | 5/2008 |
| GB | 2233837 A | 1/1991 |

(Continued)

OTHER PUBLICATIONS

Gilleo et al., "Low Ball BGA: A New Concept in Thermoplastic Packaging", IEEE 29th Intl. Elect. Manuf. Tech. Symp., 11 pages, 2006.

(Continued)

*Primary Examiner* — Jeremy Norris
*Assistant Examiner* — Tremesha S Willis
(74) *Attorney, Agent, or Firm* — Mary Louise Stanford

(57) ABSTRACT

Packaged optoelectronic device include a first barrier layer having a plurality of feedthrough apertures communicating with at least one electrode layer of the device, and a plurality of conductive patches disposed on at least one of the plurality of feedthrough apertures for electrically connecting the device to a power supply. Each conductive patch includes a conductive metal surface layer and a non-conducting surface layer having an opening exposing the metal surface layer.

20 Claims, 6 Drawing Sheets

U.S. PATENT DOCUMENTS

| | | |
|---|---|---|
| 7,015,640 B2 | 3/2006 | Schaepkens et al. |
| 7,033,850 B2 | 4/2006 | Tyan et al. |
| 7,097,501 B2 | 8/2006 | Shah |
| 7,259,505 B2 | 8/2007 | Cok |
| 7,348,193 B2 | 3/2008 | Ouyang |
| 7,394,153 B2 | 7/2008 | Auch et al. |
| 7,394,194 B2 | 7/2008 | Cok |
| 7,402,878 B2 | 7/2008 | Tarn |
| 7,422,345 B2 | 9/2008 | Lin |
| 2001/0019755 A1 | 9/2001 | Granoff et al. |
| 2002/0043932 A1 | 4/2002 | Kawashima |
| 2005/0233503 A1 | 10/2005 | Leib et al. |
| 2008/0278932 A1 | 11/2008 | Tress |
| 2009/0168391 A1* | 7/2009 | Saitou et al. .................. 361/820 |

FOREIGN PATENT DOCUMENTS

| | | |
|---|---|---|
| WO | WO2007023789 A8 | 3/2007 |
| WO | WO2007036850 A2 | 4/2007 |
| WO | WO2008012702 A1 | 1/2008 |
| WO | WO2008099305 A1 | 8/2008 |
| WO | WO2008099306 A1 | 8/2008 |

OTHER PUBLICATIONS

Seymour et al., "The Insulaton Performance of Reactive Parylene Films in Implantable Electronic Devices", Biomaterials, vol. 30, pp. 6158-6167, 2009.

Co-Pending Patent Application entitled "OLED Lighting Devices Including Electrodes with Magnetic Material", U.S. Appl. No. 12/470,067, filed May 21, 2009.

PCT International Search Report dated Aug. 13, 2010 and Written Opinion.

Philips Instruction Manual, "Lumiblade", Philips Lighting, pp. 1-12.

* cited by examiner

ELECTRICAL CONNECTORS FOR OPTOELECTRONIC DEVICE PACKAGING

CROSS-REFERENCE TO RELATED APPLICATIONS

This application is a continuation-in-part of copending U.S. application Ser. No. 12/470,033, filed 21 May 2009, the entire contents of which is incorporated herein by reference.

BACKGROUND

Optoelectronic devices generally include light-emitting devices and photovoltaic devices. These devices generally include an active layer sandwiched between two electrodes, sometimes referred to as the front and back electrodes, at least one of which is typically transparent. The active layer typically includes one or more semiconductor materials. In a light-emitting device, e.g., an organic light-emitting diode (OLED), a voltage applied between the two electrodes causes a current to flow through the active layer. The current causes the active layer to emit light. In a photovoltaic device, e.g., a solar cell, the active layer absorbs energy from light and converts this energy to electrical energy exhibited as a voltage and/or current between the two electrodes. Optoelectronic devices may be produced by various means. One approach is to use vacuum deposition of semiconductor materials, and a second approach is to use solution processed materials. Various substrates including glass and plastic film can be used as a base for depositing the layers on. Alternately, the optoelectronic device may be built using the opaque layer (metal or polymer or ceramic) as the substrate and an alternate build sequence is employed. Regardless of the construction of the device, it is necessary to provide an encapsulating hermetic package to protect it from the deteriorating effects of moisture and oxygen exposure. The package must also provide electrical interconnections in a feedthrough configuration to connect a power supply that is external to the package.

OLEDs are produced in a flat thin format for use as displays or for general illumination. The use of a plastic substrate provides the thinnest and most flexible configuration, and also the potential for low cost roll-to-roll production. Accordingly, there is a need for packaging technology that is also thin and flexible, and preferably amenable to roll-to-roll production coincident with the OLED fabrication. The package should be suitable for large area (up to about one or more square meters) displays or luminaries for particular applications.

Barrier films, referred to as ultra high barrier (UHB) films or UHBs, are used for direct fabrication of OLEDs and other optoelectronic devices. These films typically consist of a thin transparent oxide layer on a transparent plastic film, for example, as described in U.S. Pat. No. 7,015,640, U.S. Pat. No. 7,154,220, and U.S. Pat. No. 7,397,183 assigned to the General Electric Company. However, the barrier films can be damaged in handling, so that fabricating a device directly on the barrier film may degrade its performance and create a moisture ingress path. In addition, moisture and oxygen can permeate laterally through adhesive layers at the edges of the device and also through the adhesive that seals the electrical wire feedthroughs. Moreover, intrinsic moisture in the adhesive and substrate materials can damage the device. The package design must be compatible with low cost materials and continuous roll-to-roll production, and the material set must be low cost and suitable for high speed processing. Thus, there is a need for an improved thin flexible packaging technology for expanded application of low cost production of OLEDs and other optoelectronic devices. U.S. application Ser. No. 12/470,033, filed 21 May 2009 describes methods for packaging optoelectronic devices utilizing a piece or sheet of conductive material covering feedthrough apertures in a barrier layer to couple electrodes of an optoelectronic device to electrical interconnectors, and ultimately to a power supply. However, improved methods and materials for manufacturing the patch and coupling the patch to the electrodes are desirable.

BRIEF DESCRIPTION

Briefly, in one aspect, the present invention relates to processes for packaging an optoelectronic device. The process includes providing a partially packaged optoelectronic device comprising a first barrier layer having a plurality of feedthrough apertures exposing at least one electrode layer of the device; providing a plurality of conductive patches, each conductive patch comprising a conductive metal surface layer and a non-conducting surface layer having an opening exposing the conductive layer; applying a conductive patch to each of the feedthrough apertures; and making contact between the conductive metal surface layer of each conductive patch and one of the at least one electrode layers of the device. In the context of the present invention, the term "patch" refers to a piece or sheet of conductive material used to cover the feedthrough apertures.

In another aspect, the present invention relates to a packaged optoelectronic device including a first barrier layer having a plurality of feedthrough apertures communicating with at least one electrode layer of the device, and a plurality of conductive patches disposed on at least one of the plurality of feedthrough apertures; wherein each conductive patch comprises a conductive metal surface layer and a non-conducting surface layer having an opening.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
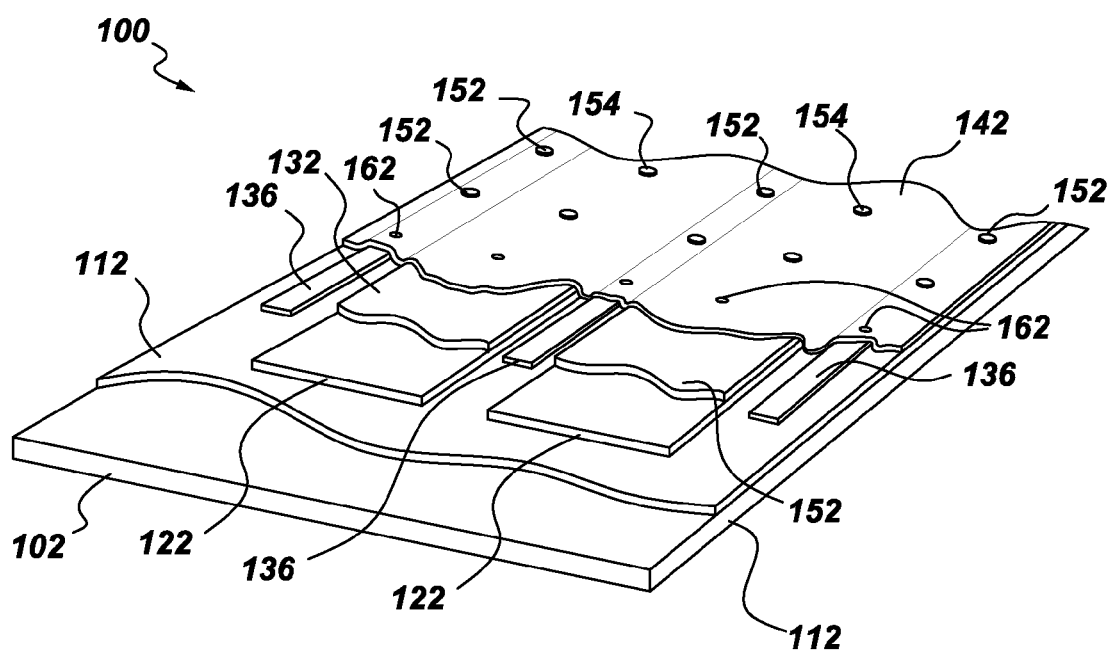
FIG. 1 is a perspective view of a packaged optoelectronic device according to the present invention.

FIG. 1 is a perspective schematic view of a packaged optoelectronic device according to the present invention. Device 100 composed of substrate 102, continuous, unpatterned anode 112, electroactive layers 122, cathode areas 132, (optional) anode buses 136, and feedthrough layer or backsheet 142, containing feedthrough apertures 162. Anode conductive patches 152 cover feedthrough apertures (not shown) that are configured to allow electrical connection between the patches and anode layer 112 through anode buses 136; an external power source may be connected through the patches to power the device. Where the anode buses are absent, the patches may be directly coupled to the anode. Similarly, cathode conductive patches 154 are electrically coupled to cathode areas 132 through feedthrough apertures (not shown). The conductive patches are composed of a conductive metal surface layer and are electrically insulated from backsheet 142 by a non-conducting surface layer (not shown). The non-conducting layer includes an opening through which the conductive metal layer is electrically coupled to the cathode or anode.

Substrate 102 may be composed of a transparent flexible material, such as flexible glass and transparent flexible plastics, such as polyesters and polycarbonates, particularly optical grades of such plastics. Substrate 102 may additionally include a transparent barrier layer, or multiple barrier layers. Materials suitable for use as barrier layers include, but are not limited to those having a moisture permeability rate less than approximately $10^{-4}$ cc/m$^2$/day, preferably less than $10^{-5}$ cc/m$^2$/day, and more preferably less than approximately $10^{-6}$ cc/m$^2$/day (at 23° C.), particularly UHB materials, such as described in U.S. Pat. No. 7,015,640, U.S. Pat. No. 6,413,645, U.S. Pat. No. 6,492,026, U.S. Pat. No. 6,537,688, and U.S. Pat. No. 6,624,568, flexible or rigid glass, transparent metals and oxides having sufficient moisture and/or oxygen barrier properties, such as ITO, and combinations of these. In some embodiments, UHB materials or glass may be used, and in particular embodiments, UHB materials are used.

Materials for use as anode 112 are well known in the art, and will not be discussed in detail. In particular embodiments, the anode may be composed of indium tin oxide (ITO), especially where the optoelectronic device is an OLED. Materials, configurations of those materials, and processes for fabricating OLED devices, are described in U.S. Pat. No. 6,661,029, U.S. Pat. No. 6,700,322, U.S. Pat. No. 6,800,999 and U.S. Pat. No. 6,777,871, assigned to General Electric Company, the contents of which are incorporated by reference. Electroactive layers 122 may be composed of various layers of materials as described in the referenced patents.

Cathode areas 132 and anode bus 136 are typically composed of a material having a low work function value such as aluminum. In some embodiments, besides the aluminum, calcium or a metal such as silver, magnesium, or a magnesium/silver alloy. Alternatively, the cathode may be made of two layers to enhance electron injection. Non-limiting examples of the cathode may comprise a thin inner layer of LiF followed by a thicker outer layer of aluminum, or a thin inner layer of calcium followed by a thicker outer layer of aluminum or silver.

Backsheet 142 may be any impermeable thin film, including metal foils, or polymer films such as Honeywell ACLAR® polychlorotrifluoroethylene (PCTFE). Multilayer foils that include a thin interface layer, a barrier layer, and an optional insulating or non-conducting layer, may also be used, particularly commercially available multilayer packaging or lidding materials having moisture- and optionally oxygen-barrier properties in the form of films or sheets, especially heat-sealable materials. Lidding materials are typically composed of multiple thin polymer layers; lidding foils also include a metal foil, typically aluminum, sandwiched between polymer layers. One example of a suitable material for backsheet 201 is Tolas TPC-0814B lidding foil, produced by Tolas Healthcare Packaging, Feasterville, Pa., a division of Oliver-Tolas, Grand Rapids, Mich. Feedthrough apertures 162 are formed in backsheet 142 using any suitable methods, including punching, die cutting, and laser machining. The apertures may be round, of varied diameter, or of other shapes and aspect ratios depending on the layout of the device and other design factors.

Figure 2A:
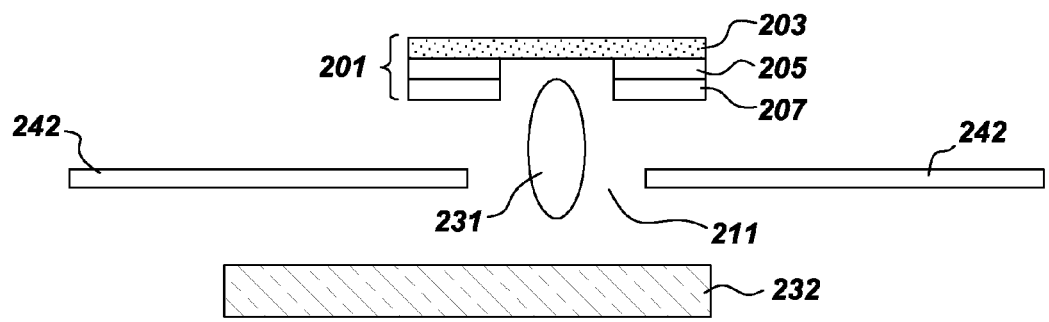
FIGS. 2A and 2B are partial cross-sectional views of a packaged optoelectronic device showing details of patch construction.
Figure 2B:
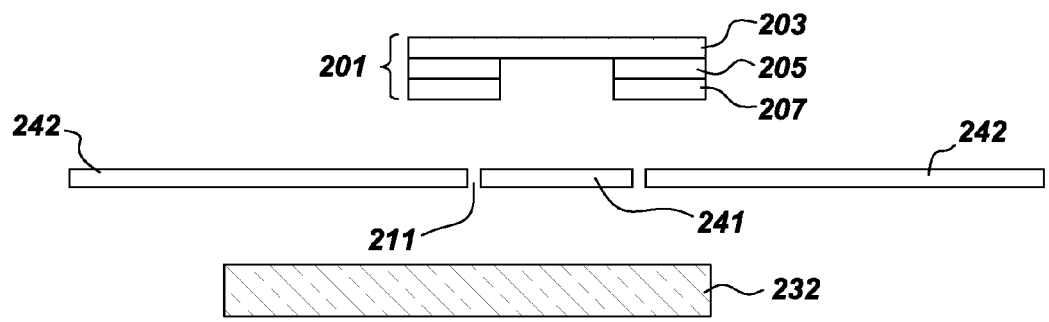

FIGS. 2A and 2B show details of patch construction and integration with backsheet 242 and electrode 232, either an anode or a cathode, of a packaged optoelectronic device according to the present invention, illustrating structures for electrically coupling the patch to the device. Patch 201 is composed of conductive layer 203, optional non-conducting layer 205 and adhesive layer 207. It is substantially larger than feedthrough aperture 211 and may be sealed to backsheet 242 by adhesive layer 207. Suitable materials for conductive layer 203 include sheets or foils of conductive metal, such as aluminum, stainless steel, or copper, that are of sufficient thickness and homogeneity to be impermeable to moisture, oxygen, and/or other vapors that may have a deleterious effect on the device. Non-conducting layer 205 prevents physical and electrical contact between conductive layers of patch 201 and backsheet 242, and is composed of a non-conductive polymer material that does not melt or flow at fabrication temperatures, typically greater than about 100° C. One example of a suitable material is polyimide. A copper foil-polyimide laminate may be used for conductive layer 203 and non-conducting layer 205; one material that may be used is PYRALUX® AC 182000R, commercially available from DuPont. Adhesive layer 207 may be composed of a thermoplastic or thermoset material. Selection criteria for the adhesive include whether it is a single or dual component system, shelf life, processing/application/solvents, optical coupling, cure temperature (if any), electrode (cathode) compatibility, adhesion, and moisture resistance. Examples of suitable thermoplastics include EVA (ethylene vinyl acetate copolymers), ADCOTE® heat sealable ethylene copolymers available from Rohm & Haas Company, PRIMACOR® ethylene acrylic acid copolymers available from Dow, and pressure sensitive adhesives, such as 3M film 200 MP (2 to 5 mil) or Flexcon Flexmark V-95 acrylic adhesives. Examples of suitable thermosetting adhesives that typically require frozen or two-component blends, include epoxies, such as those available from 3-Bond and Robnor, urethanes (two component), available from Mitsui Tekenate and 3M, and two-component acrylic systems, available from Loctite/Henkel, Lord, and 3M. Systems that require additional handling such as the frozen and two-component blends are less desirable, but may be used if desired.

Patch 201 is electrically coupled to electrode 232 by conductive element 231 (FIG. 2A) or conductive element 241 (FIG. 2B). either of which are conveniently formed from an electrically conductive adhesive applied in feedthrough aperture 211. FIG. 2A illustrates use of a conductor-filled adhesive paste, for example, a conductive silver filled epoxy adhesive paste, such as Staystik 571, available from Cookson Electronics, Alpharetta, Ga. Contact between a backsheet composed of a metal and conductive element 231 may result in electrical shorting and may be prevented by controlling the amount of paste applied to feedthrough aperture 211. In FIG. 2B, conductive element 241, in the form of a film may be composed of an isotropic or anisotropic electrically conductive tape, consisting of a conductive acrylic pressure sensitive adhesive loaded with conductive particles. Anisotropic conductive films allow interconnection through the adhesive thickness, that is, in the Z-direction, but are electrically insulating in the plane of the adhesive, the X- and Y-directions. Isotropic conductive films may be conductive in all of the X-, Y-, and Z-directions. Examples of suitable conductive film materials include 3M 9703, 3M 9709SL and Adhesive Research ARcare8881.

Figure 3:
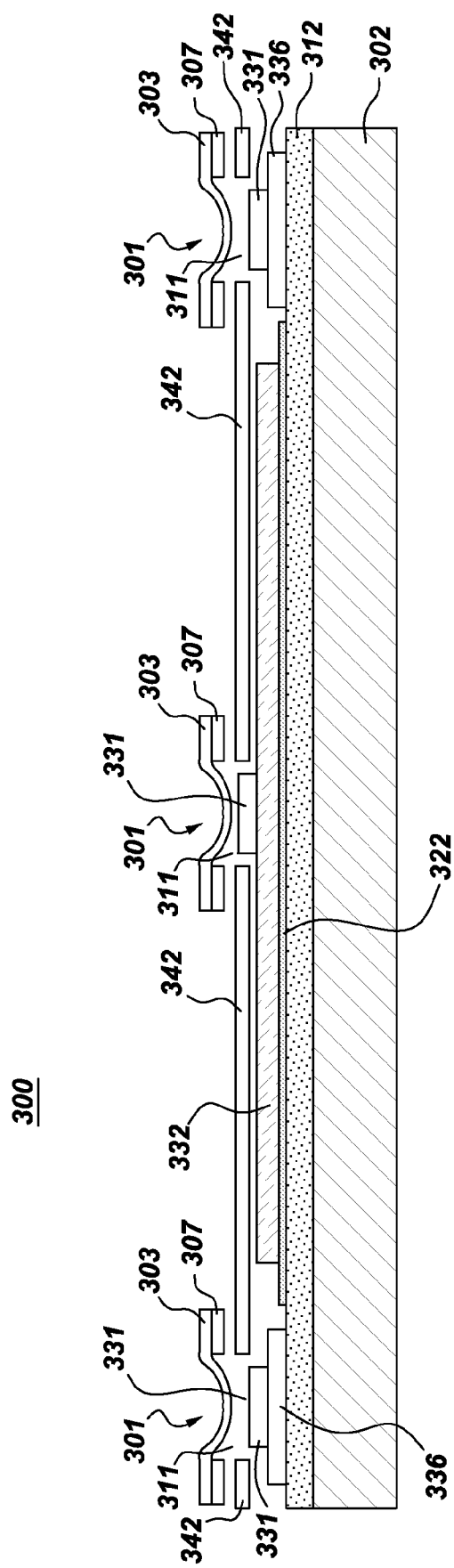
FIG. 3 is a cross-section view of a packaged optoelectronic device having a contoured conductive patches.

FIG. 3 shows an alternate embodiment of an optoelectronic device according to the present invention device 300, in which the surface profile on both sides of patch 301 is contoured. Patch 301 is composed of conductive layer 303, optional insulating layer (not shown), and non-conductive adhesive layer 307 and has a bowl-shaped or dimple-shaped indentation at its center. The insulating layer and adhesive layer 307 have been removed in the area opposite the indentation, exposing conductive layer 303 on both sides. The depth of the indentation on the patch before installation is $d_1$. The cross sectional area at any location of the patch remains constant across the area of the patch. The depth $d_1$ is equal or larger than the step height $d_2$. Step height $d_2$ is the step from the contacts to the isolating layer of the backsheet in the feedthrough aperture. When the patch is installed on insulating layer of the backsheet via the adhesive layer, $d_1$ will become equal to $d_2$ because of plastic and elastic deformations that take place of the most compliant material layers during the patch installation process. The patch can be installed using roll lamination or vacuum lamination. The forces, moments and pressures in the feedthrough after installing the patch to the backsheet are the result of plastic and elastic deformations of the material system that occur when the indentation depth $d_1$ is greater than step height $d_2$. Force F is the adhesion force from the adhesive layer bonding the patch to the backsheet. Force F acts on the patch in an annular perimeter zone around the perimeter. Force F also acts with equal magnitude but opposite direction on the annular zone around the feedthrough hole in the backsheet, and results in a pressure field p in the center of the patch. The pressure zone is created at the electrical interfaces between the patch, the conductive adhesive and the anode and cathode contacts. The pressure field p decreases the contact resistance between the patch, conductive adhesive and the electrode contacts (anode and cathode).

Transparent layers of device 300 include combination substrate and barrier layer 302, optional adhesion promotion layer (not shown) and optional optical outcoupling layer (not shown) and electrode (anode) 312. Electroactive layers 322 and 332 are disposed on anode 312. The other side of package 300 consists of multi-layer backsheet 342 that contains adhesive layer (not shown) and optional non-conducting layer (not shown). The adhesive layer on multi-layer backsheet 342 and the optional adhesion promotion layer form a seal zone with combination substrate and barrier layer 302 at the perimeter of package 300. Adhesive layers 307 form seal zones with multi-layer backsheet 342 around the feedthrough aperture 311. Electrical connection to anode bus 336 and cathode 332 is made through feedthrough aperture 311 in backsheet 342 through conductive adhesive 331.

Figure 4A:
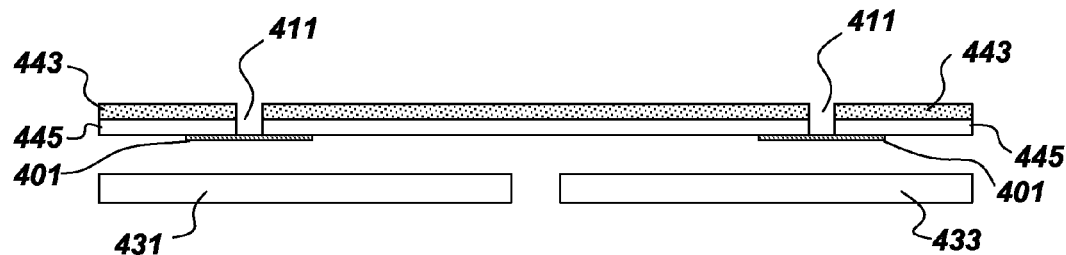
FIGS. 4A-4C are partial cross-sectional views of a packaged optoelectronic device showing patches is various locations.
Figure 4B:
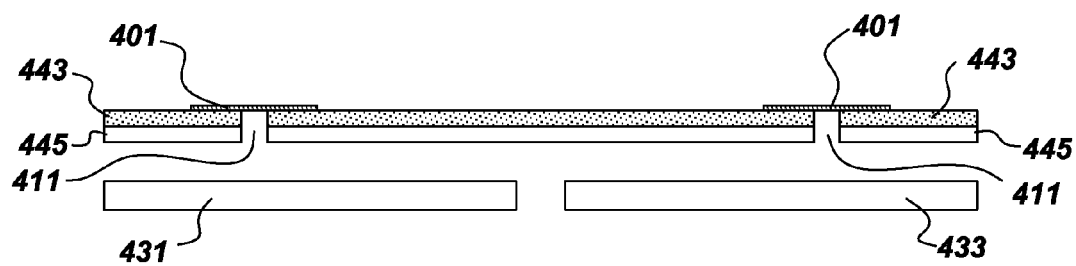
Figure 4C:
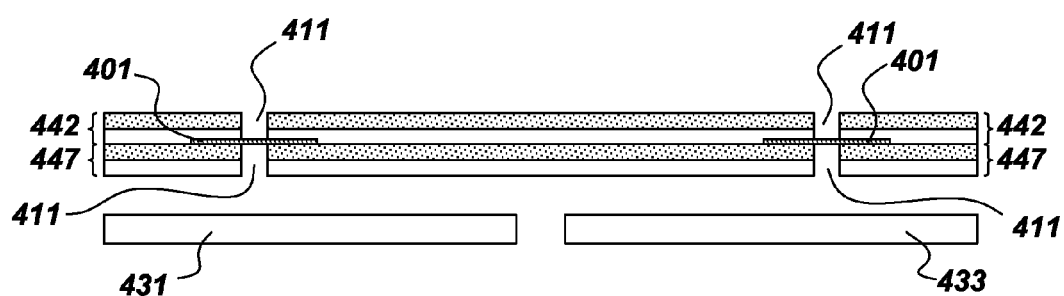

FIGS. 4A-4C show schematically embodiments of the present invention wherein conductive patches 401 and feedthrough apertures 411 are disposed in different locations within a package. In FIG. 4A, patch 401 is located between backsheet 442, composed of conductive metal surface layer 443 and insulating layer 445, and electrode 431 and electrode 433. In FIG. 4B, backsheet 442, with conductive metal surface layer 443 and insulating layer 445, is located between electrode 431 or electrode 433 and patch 401. In FIG. 4C, patch 401 is located between first backsheet barrier layer 442, which functions as a barrier layer, and is made up of conductive metal surface layer 443 and insulating layer 445, and second backsheet 447, also functioning as a barrier layer, and made up of conductive metal surface layer 448 and insulating layer 449.

The present invention also relates to processes for packaging an optoelectronic device. The processes include
providing a partially packaged optoelectronic device comprising a first barrier layer having a plurality of feedthrough apertures exposing at least one electrode layer of the device;
providing a plurality of conductive patches, each conductive patch comprising a conductive metal surface layer and a non-conducting surface layer having an opening exposing the conductive layer;
applying a conductive patch to each of the feedthrough apertures; and
making contact between the conductive metal surface layer of each conductive patch and one of the at least one electrode layers of the device.

The step of providing a plurality of conductive patches may include removing a portion of the at least one non-conducting layer to form a via and exposing the conductive metal through the via.

EXAMPLES

The following examples illustrate a process according to the present invention.

Example 1

FIG. 5 is a flowchart graphically illustrating steps for fabricating a patch. FIG. 5A shows the starting material, single sided copper clad laminate 560. Pyralux AC-182000R, available from DuPont, which is 18 micron thick copper foil 563 attached to 20 micron thick polyimide dielectric 561, was used.

Fabrication of Patch Using Copper Clad Material

Figure 5A:
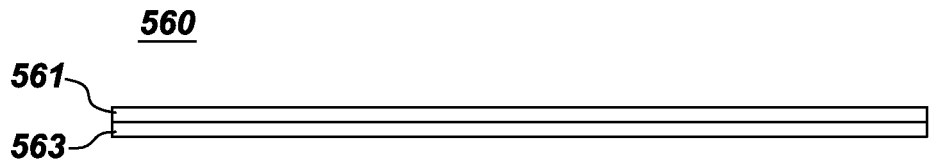
FIGS. 5A-5E is a schematic diagram of a process for fabricating a packaged optoelectronic device according to the present invention.
Figure 5B:
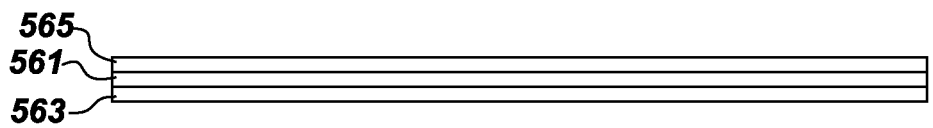
Figure 5C:
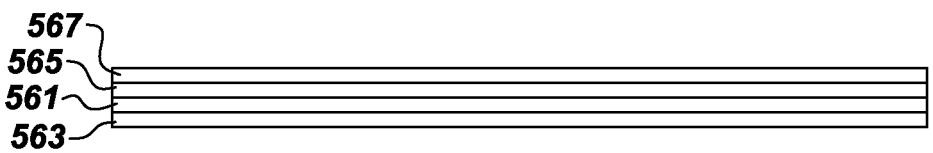
Figure 5D:
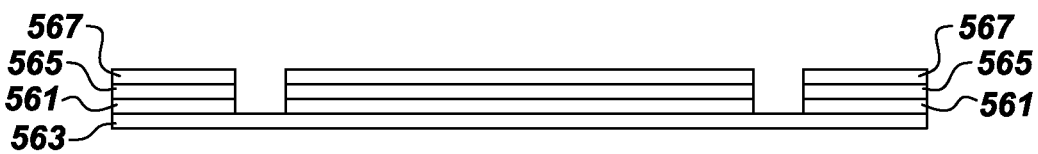
Figure 5E:
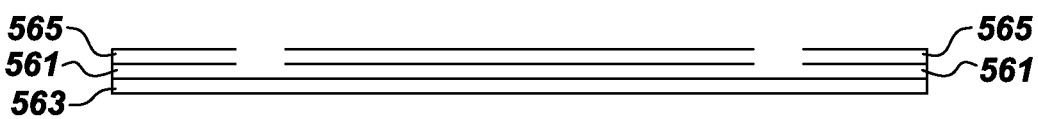
Figure 6:
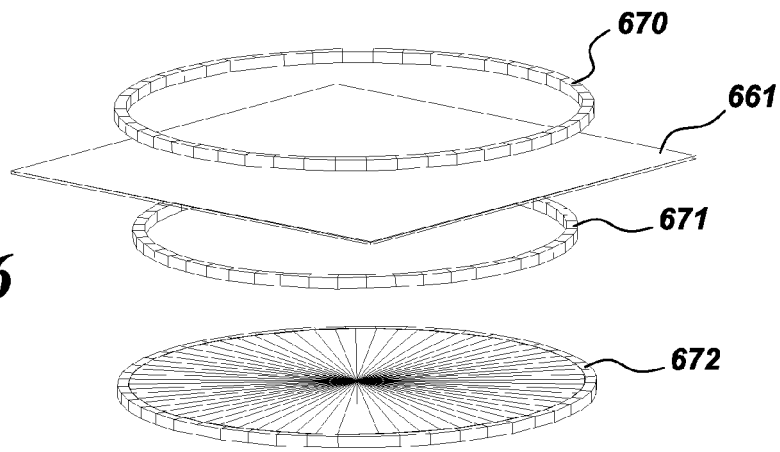
FIG. 6 shows an apparatus for fabricating patches for use in packaged optoelectronic device according to the present invention.
Figure 7A:
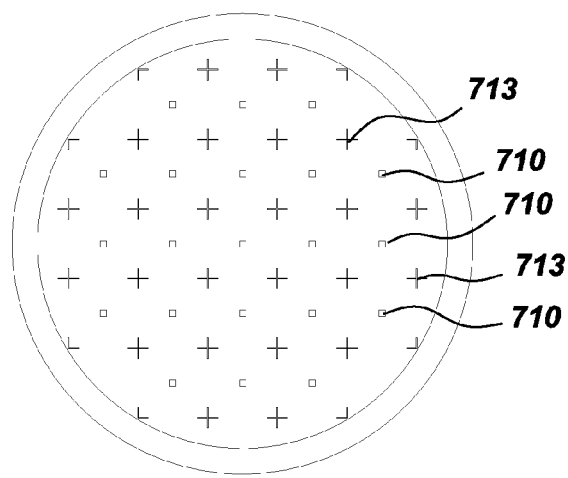
FIGS. 7A and 7B are illustrations of artwork for use in singulating patches for packaged optoelectronic device according to the present invention.
Figure 7B:
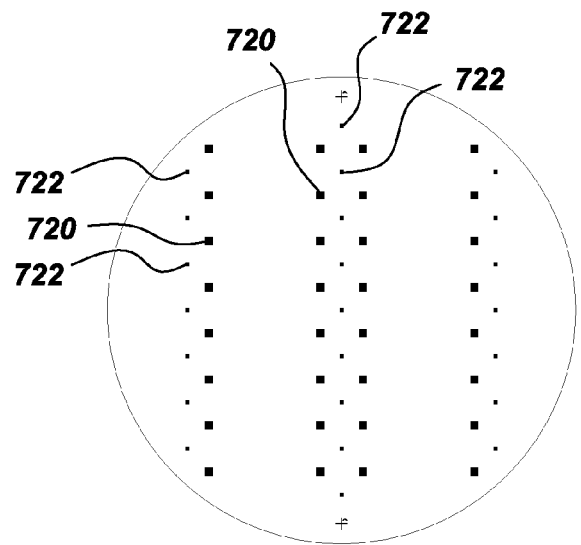

A sheet of the copper clad material 661 is attached to a frame or pressed into snap rings 670, 671, and 672 as shown in FIG. 6. The film is cleaned, the dielectric side is optionally plasma treated to improve adhesion to its surface. In the next step, illustrated in FIG. 5B, polyimide dielectric 561 is then coated with adhesive 565. The adhesive layer 565 is Adcote 37T77, available from Rohm and Hass, which is applied by spin coating. Other possible methods include spray coating or slot die coating. The solvent in the adhesive is removed by baking, leaving a thermoplastic coating which is tack-free at room temperature. In FIG. 5C, release film 567 is applied to the surface of this adhesive to protect it during subsequent processing steps. The next step, shown in FIG. 5D is to selectively remove part of polyimide dielectric 561, adhesive 565, and release film 567 from the center of the patch to expose the conductive copper material 563. In this embodiment, a 12 micron thick Kapton polyimide layer is placed over the top of the Adcote adhesive 565 and lightly laminated to the surface at 115° F. using a vacuum-pressure lamination process. This process lasts about one minute under vacuum followed by one minute under pressure using an OPTEK DPL-24 Differential Pressure Laminator. The Kapton acts as a release film that is only lightly attached to the adhesive under these processing conditions. Patterned sections of the release layer, adhesive and polyimide clad are then removed to expose the metal foil. This is most easily accomplished using direct write, laser ablation tool, such as an ESI-5200 UV laser. Using a square-spiral tool path, large areas of the coatings can be removed to expose the metal foil with minimal soot. Using step and repeat, single or multiple contact areas in each patch are made as well as placement of alignment points for subsequent singulation of the patches are made using a single artwork. Following laser ablation, the sample is processed through a reactive ion etch process to remove any remaining soot on the metal surface to ensure good electrical contact. Release layer 567 is then removed as shown in FIG. 5E, leaving behind polyimide dielectric 561, adhesive 565, conductive copper material 563, and patches singulated for use. FIGS. 7A and 7B show artwork for use in singulating. FIG. 7A shows rows of openings 710 and crosses 713 indicating corners of each patch. FIG. 7B shows artwork for patches containing two openings 720 each; dots 722 indicate corners of the patches.

The electrical connection between the copper of the patch and the evaporated aluminum that form the anode contact and cathode contact is made with Tra-Duct 2902 conductive silver filled epoxy that is cured for 30 to 60 minutes at a temperature of 70 degrees Celsius. After curing the epoxy the patch is laminated to the backsheet at 140 degrees F.

Example 2

The conductive adhesive layer is an electrically conductive tape with silver particles and pressure sensitive adhesive such as 9707SL available from 3M Company. This tape is electrically conductive in the x-, y- and z-directions. Other suitable materials are pressure sensitive adhesive tapes that are electrically conductive in only the normal direction (z-direction) such as 3M 9703 or 9705. The conductive tape is put down on the contacts on the OLED before the backsheet is put down. Another possibility is to put down the tape on the patch. The backsheet is TOLAS 0814B with 5 mm diameter feedthrough aperture holes. The step height is 100-125 micrometers at the holes. Square patch of 20 mm by 20 mm is cut out from Pyralux AC-182000R copper clad material available from DuPont. The adhesive region and insulating dielectric region are produced as described in Example 1. The adhesive is ADCOTE® 37T77, supplied by Rohm & Haas Company, but could also be a pressure sensitive adhesive (PSA) or similar adhesive that is favorable for roll-to-roll production.

A circular indentation with a depth $d_1$ of 200 μm to 300 μm is formed in the center of the patch where the conductive copper is exposed. The indentation is formed by plastically deforming the copper metal layer with a steel punch and soft backing surface. Other methods to make the indentation include knurling, stamping and laser forming. The difference in indentation depth $d_1$ and step height $d_2$ at the holes of 100 μm to 125 μm and the compliance of the stacked adhesive layers and optional insulative layer determine the magnitude of the pressure field p1 at the electrical contact zone and the normal forces F at the perimeters of the feedthrough aperture hole and patch. The normal forces preload the electrical contact area and decrease contact resistance.

It is also possible to change the patch by altering its cross sectional area. The cross sectional area of the patch can be increased in select areas, for example by means of electrolytic plating or adding solder paste or silver epoxy. The cross sectional area of the patch can also be decreased in select areas, for example by chemical etching processes or laser ablation. The cross section of the patch 160 should be altered so that it is thicker in the center and thinner at the perimeter. During roll or vacuum lamination of the patch 160 to the backsheet the contoured patch design will see increased pressure at its center. When going through a roll or vacuum lamination step more pressure is exerted on the electrical contact zone compared to a patch that is contoured with a constant thickness or cross section geometry.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A roll to roll process for packaging an optoelectronic device, said process comprising providing a partially packaged optoelectronic device in roll format, said partially packaged optoelectronic device comprising a substrate, a plurality of electroactive layers sandwiched between a cathode and an anode, and a first barrier layer having a plurality of feedthrough apertures exposing the cathode and the anode; providing a plurality of conductive patches, each conductive patch comprising a conductive metal surface layer and a non-conducting surface layer having an opening exposing the conductive layer; applying a conductive patch to each of the feedthrough apertures; and making contact between the conductive metal surface layer of each conductive patch and at least one of the cathode and the anode.

2. A process according to claim 1, wherein providing a plurality of conductive patches comprises removing a portion of the at least one non-conducting layer to form a via and exposing the conductive metal through the via.

3. A process according to claim 2, additionally comprising forming an indentation in the conductive metal surface.

4. A process according to claim 3, additionally comprising removing a portion of the at least one non-conducting layer in an area opposite the indentation.

5. A process according to claim 1, additionally comprising disposing a conductive adhesive material within each of the plurality of feedthrough apertures.

6. A process according to claim 5, wherein making contact between the conductive metal surface layer of each conductive patch and one of the at least one electrode layers of the device comprises making contact through the conductive adhesive material.

7. A process according to claim 5, wherein the conductive adhesive material is derived from a conductive thermosetting adhesive.

8. A process according to claim 5, wherein the conductive adhesive material is an anisotropic conductive film.

9. A process according to claim 5, wherein the conductive adhesive material is an isotropic conductive film.

10. A process according to claim 5, wherein the conductive adhesive material is a conductive silver filled epoxy.

11. A process according to claim 1, additionally comprising sandwiching the conductive patches between the first barrier layer and a second barrier layer having a plurality of feedthrough apertures, wherein each conductive patch is exposed through at least one of the plurality of feedthrough apertures.

12. A process according to claim 2, wherein removing a portion of the at least one non-conducting layer to form a via and exposing the conductive metal through the via comprises
    mounting to a support a metal-clad laminate comprising a conductive metal surface and at least one non-conducting layer;
    coating the at least one non-conducting layer with an adhesive layer;
    applying a release coating to the adhesive layer; and
    ablating a portion of each of the non-conducting layers to expose the conductive metal surface.

13. A process according to claim 2, wherein applying a conductive patch to each of the feedthrough apertures comprises removing the release film from the non-conducting surface and disposing the conductive patch on at least one of the feedthrough apertures.

14. A packaged optoelectronic device in roll format, the packaged optoelectronic device comprising a substrate, a plurality of electroactive layers sandwiched between a cathode and an anode and a first barrier layer having a plurality of feedthrough apertures exposing at least the cathode or the anode of the device, and a plurality of conductive patches disposed on at least one of the plurality of feedthrough apertures;

wherein each conductive patch comprises a conductive metal surface layer and a non-conducting surface layer having an opening.

15. A packaged optoelectronic device according to claim 14, wherein a conductive adhesive material is disposed within each of the plurality of feedthrough apertures and contacts the conductive metal surface layer and one of the at least one electrode layers.

16. A packaged optoelectronic device according to claim 14, wherein the conductive adhesive material is derived from a conductive thermosetting adhesive.

17. A packaged optoelectronic device according to claim 14, wherein the conductive adhesive material is an anisotropic conductive film.

18. A packaged optoelectronic device according to claim 14, wherein the conductive adhesive material is an isotropic conductive film.

19. A packaged optoelectronic device according to claim 14, wherein the conductive adhesive material is a conductive silver filled epoxy.

20. A packaged optoelectronic device according to claim 14, wherein the plurality of conductive patches is sandwiched between the first barrier layer and a second barrier layer.

* * * * *